United States Patent
Ho et al.

(10) Patent No.: US 8,546,184 B2
(45) Date of Patent: Oct. 1, 2013

(54) PACKAGE SUBSTRATE HAVING DIE PAD WITH OUTER RAISED PORTION AND INTERIOR RECESSED PORTION

(71) Applicant: Texas Instruments Incorporated, Dallas, TX (US)

(72) Inventors: Chih-Chien Ho, Taipei (TW); Saihsi Jen, Taipei-Hsien (TW); Eric Hsieh, Taipei-Hsien (TW)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/734,239

(22) Filed: Jan. 4, 2013

(65) Prior Publication Data

US 2013/0122654 A1 May 16, 2013

Related U.S. Application Data

(62) Division of application No. 13/175,587, filed on Jul. 1, 2011, now Pat. No. 8,455,989.

(51) Int. Cl.
*H01L 21/00* (2006.01)

(52) U.S. Cl.
USPC .......................................... 438/106; 257/676

(58) Field of Classification Search
USPC .......................................... 257/676; 438/106
See application file for complete search history.

(56) References Cited

U.S. PATENT DOCUMENTS

2003/0003625 A1\* 1/2003 Kotzias et al. ............... 438/112

\* cited by examiner

*Primary Examiner* — David Vu
*Assistant Examiner* — Brandon Fox
(74) *Attorney, Agent, or Firm* — Steven A. Shaw; W. James Brady; Frederick J. Telecky, Jr.

(57) ABSTRACT

A method of forming an electronic assembly includes dispensing a die attach material on a substrate into a recessed portion that includes an inner recessed portion of including a die pad. The die attach material is not dispensed on an outer raised flat portion of the die pad. A semiconductor die is attached directly on the outer raised flat portion and affixed to the die pad with said die attach material in said interior recessed portion but not on said outer raised flat portion.

6 Claims, 4 Drawing Sheets

PACKAGE SUBSTRATE HAVING DIE PAD WITH OUTER RAISED PORTION AND INTERIOR RECESSED PORTION

CROSS-REFERENCE TO RELATED APPLICATIONS

The present application is a Divisional of and claims priority to U.S. patent application Ser. No. 13/175,587 filed on Jul. 1, 2011, which is hereby incorporated herein by reference.

FIELD

Disclosed embodiments relate to semiconductor packaging, and more specifically to substrates for packaged semiconductor devices that include non-planar die pads.

BACKGROUND

One type of semiconductor package is referred to as a ball grid array (BGA) package. BGA packages were developed to provide a higher lead count and a smaller foot print as compared to conventional plastic or ceramic semiconductor packages. A BGA package includes an area array of solder balls that permit the package to be surface mounted to a printed circuit board (PCB) or other electronic component.

A conventional BGA package includes a planar dielectric substrate, a semiconductor die mounted to the substrate using a die attach material (e.g., a paste), and an encapsulating epoxy resin which encapsulates the die. The substrate is initially a segment of a substrate panel (or sheet). The substrate panel includes multiple substrates that is used to simultaneously fabricate multiple BGA packages. Following the fabrication process for the BGA packages, the substrate panel is singulated into individual BGA package devices.

Typically, the substrate comprises a reinforced polymer laminate material, such as bismaleimide triazine (BT), or a polyimide resin. The substrate includes a planar die attach surface that generally comprises a dielectric solder resist layer on a metal layer (e.g., copper). During a die attach step of the assembly process, the semiconductor die is adhesively bonded to a planar solder resist layer on the substrate using a die attach adhesive. The semiconductor die is then bonded to bond pads on the substrate that are revealed by apertures in the solder resist layer.

Another type of package substrate is a lead frame that is generally processed as a lead frame sheet. For lead frames the die pad is generally flat and comprises a metal and a plurality of metal lead fingers are around the die pad.

Both dielectric substrates for BGA packages and lead frames for lead frame-based devices are subject to problems associated with the inability to control the volume of die attach material either under the semiconductor die in the case of under dispense, or lateral to the semiconductor die in the case of over dispense. Such inability to control the volume of the die attach material in the case of wirebonding assembly can result in wire bond failures between the semiconductor die and pads on a package substrate or the lead fingers of a lead frame.

SUMMARY

Disclosed embodiments include substrate designs that comprise a die pad having an outer raised flat portion and a recessed portion including an interior recessed portion. The semiconductor die sits directly on the outer raised flat portion so that there is no intervening die attach material between the semiconductor die and the outer raised flat portion. Disclosed embodiments have been found to solve the above-described assembly problems leading to wire bond failures when using conventional substrate designs including both tilting of the semiconductor die and the die attach material bleeding out so that it covers the substrate pads.

Disclosed embodiments apply to a variety of package substrates including dielectric (e.g., organic or ceramic) substrates, as well as lead frames. In the case of dielectric substrates, the outer raised flat portion can be provided by solder resist, while for lead frame embodiments the outer raised flat portion can comprise a metal or metal alloy.

DETAILED DESCRIPTION

Figure 1:
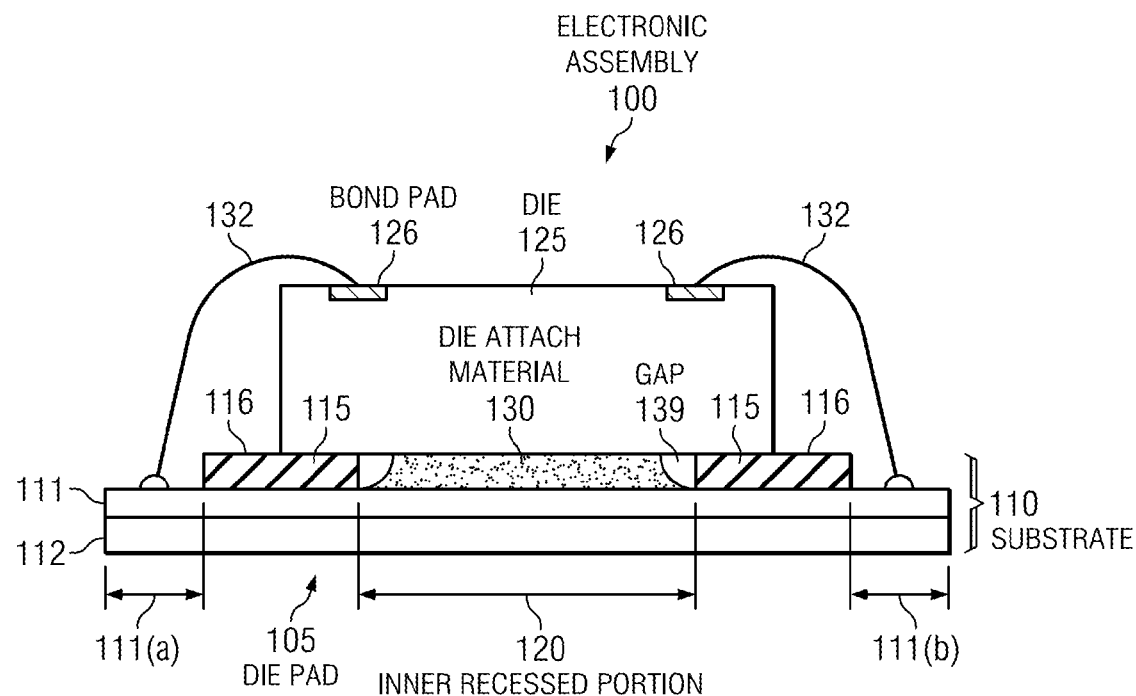
FIG. 1 is a cross sectional depiction of an example electronic assembly, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a cross sectional depiction of an example electronic assembly 100 before encapsulation, according to an example embodiment. Electronic assembly 100 is shown comprising a substrate 110 that includes a die pad 105. The die pad 105 includes an outer raised flat portion 115 and a recessed portion that includes an inner recessed portion 120. A semiconductor die 125 is directly on the outer raised flat portion 115 and is affixed to the die pad by a die attach material 130 that is on the inner recessed portion 120. The die attach material 130 can be seen to not be on a top surface 116 of the outer raised flat portion 115.

Substrate 110 in the embodiment shown in FIG. 1 includes a metal layer 111 that is on a dielectric material 112, such as a polyimide in one particular embodiment. The outer raised flat portion 115 of substrate 110 can be provided by a dielectric material, such as in the form of a solder resist layer. The dielectric material, such in the form of a patterned solder resist layer, is shown providing the outer raised flat portion 115 that defines the inner recessed portion 120, which also exposes the plurality bond pads 111(*a*) and 111(*b*).

Solder resist (or solder mask) as used herein and known in the art is a lacquer-like layer of polymer (e.g., an epoxy) that provides a permanent protective coating for metal (e.g., copper) traces of substrates including printed circuit boards (PCBs) that prevents solder from bridging between conductors, thereby preventing short circuits. One solder resist material is epoxy liquid that is silkscreened through a pattern onto the substrate. Other types are the liquid photoimageable solder mask (LPSM) inks and dry film photoimageable solder mask (DFSM). All three of these processes go through a thermal cure of some type after the pattern is defined.

Metal layer 111 provides metal traces a plurality of substrate contact pad regions, such as contact pad regions 111(a) and 111(b) that are shown coupled to bond pads 126 on semiconductor die 125 by bond wires 132. FIG. 1 shows a gap 139 under the semiconductor die 125 along at least a portion of a boundary between an outer edge of said die attach material 130 on the interior recessed portion 120 and an inside edge of the raised flat portion 115. The gap 139 shown demonstrates that there is no need for complete (100%) filling of the inner recessed portion 120 with the die attach material 130, which can save cost by conserving die attach material.

Figure 2:
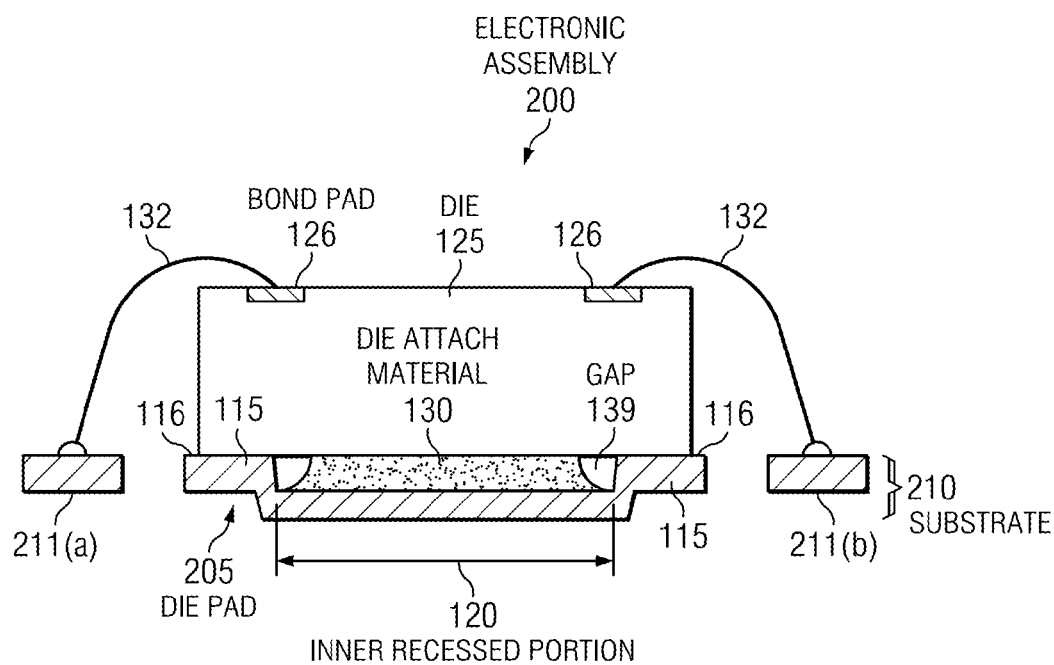
FIG. 2 is a cross sectional depiction of another example electronic assembly, according to an example embodiment.

FIG. 2 is a cross sectional depiction of another example electronic assembly 200 before encapsulation, according to an example embodiment. The substrate 210 comprises a metal or metal alloy (that may include a thin surface metal layer) that is part of a lead frame that includes a plurality of lead fingers 211(a) and 211(b) positioned outside at least one side of the die pad 205. The outer raised flat portion 115 of die pad 205 in this embodiment also comprises the metal or metal alloy provide by substrate 210. Bond pads 132 on the semiconductor die 125 are connected by bond wires 132 to the plurality of lead fingers 211(a), 211(b).

Figure 3A:
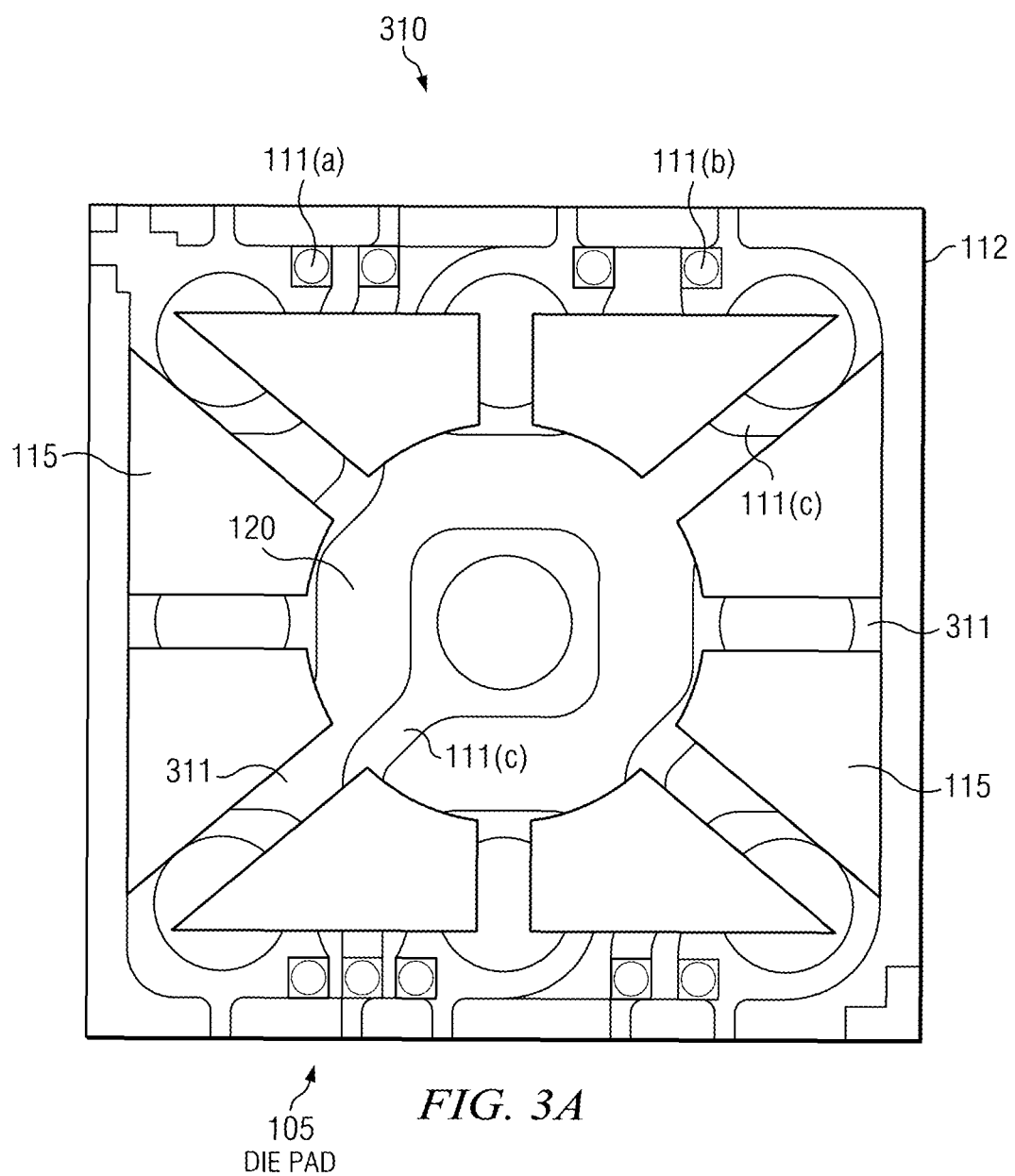
FIGS. 3A-C show top view depictions after successive steps in an example assembly method using a disclosed substrate to form the electronic assembly shown in FIG. 1, according to an example embodiment.
Figure 3B:
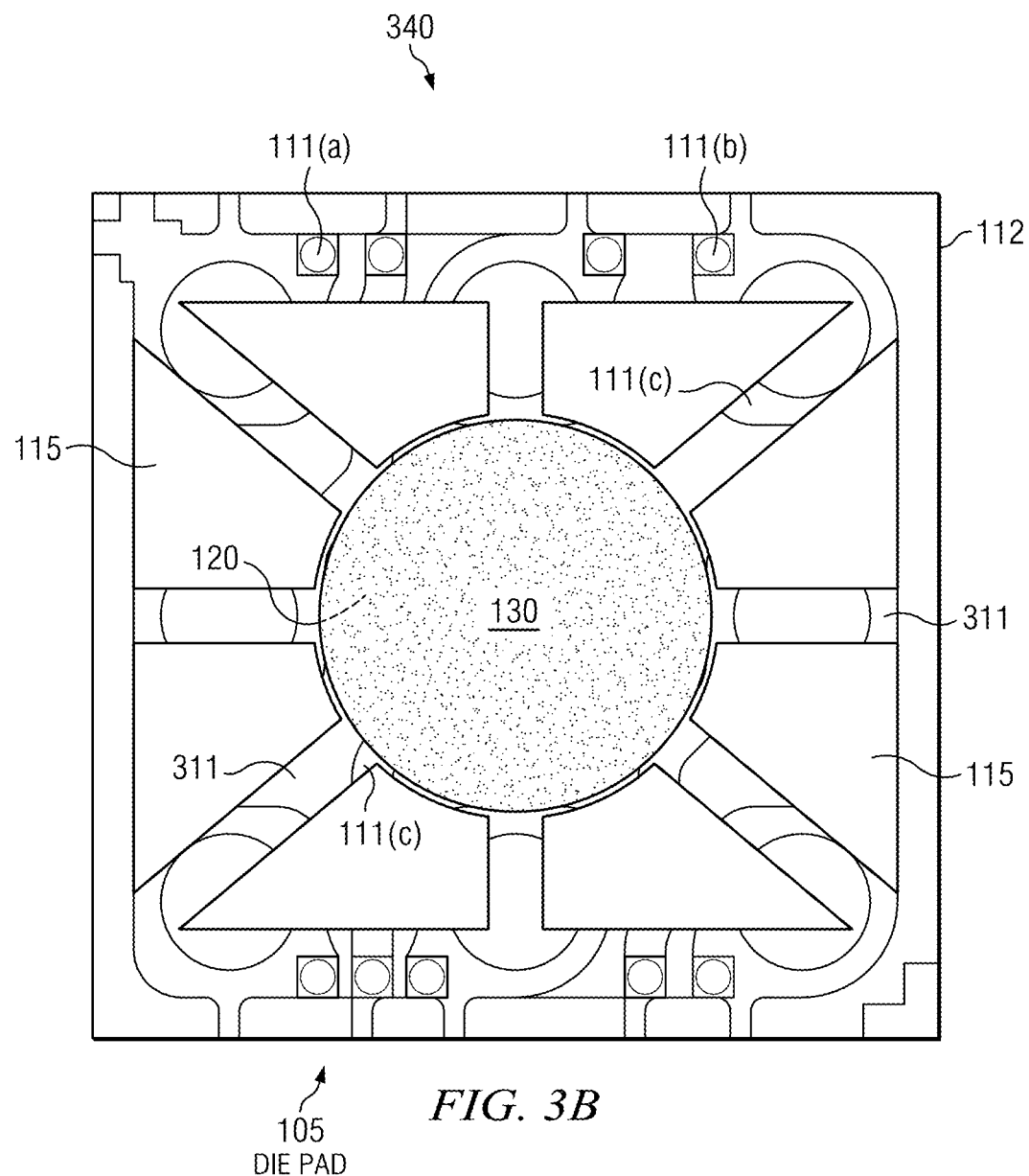
Figure 3C:
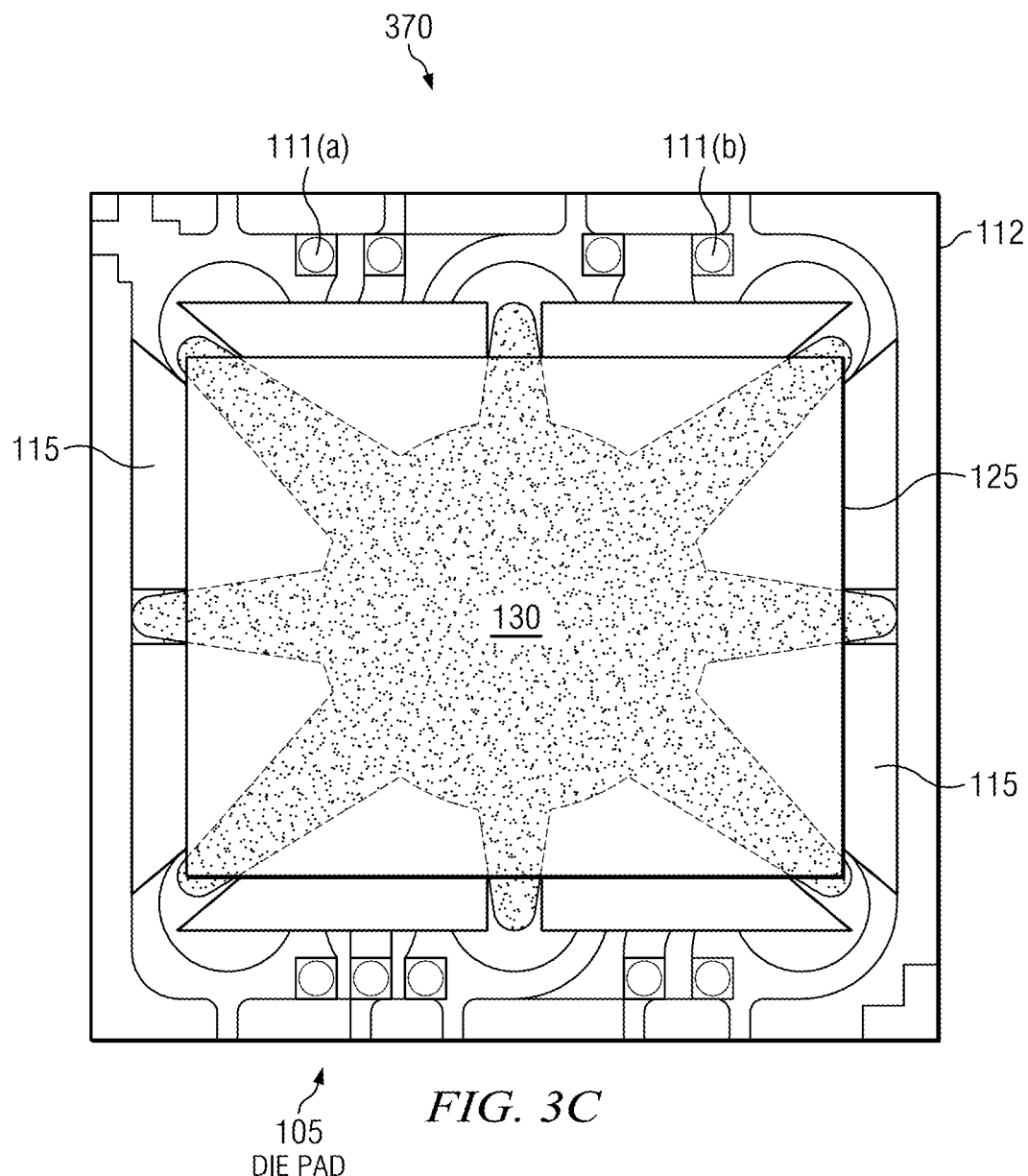

FIGS. 3A-C show top view depictions after some of the successive steps in an example assembly method using a disclosed substrate to form the electronic assembly 100 shown in FIG. 1, according to an example embodiment. Although a single electronic assembly is described as being formed, it is understood that typically a large number of electronic assemblies will be simultaneously formed, and a substrate panel (e.g., organic polymer panel) or substrate sheet (e.g., lead frame sheet) will provide a plurality of interconnected substrates for simultaneous assembly. The depiction 310 shown in FIG. 3A is after forming a patterned solder resist layer on a dielectric material 112 that includes an outer raised flat portion 115 that defines an inner recessed portion 120, where the inner recessed portion 120 further comprises a plurality of slits 311 that are exclusive of solder resist material. The slits 311 are connected to the inner recessed portion 120. Metal traces are shown as 111(c) providing coupling to the die pad 120 and contact pad regions 111(a) and 111(b).

The depiction 340 shown in FIG. 3B is after dispensing of die attach material (e.g., paste) to the area of the inner recessed portion 120, that can generally by accomplished by standard die attach dispense equipment. The depiction 370 shown in FIG. 3C is after die attachment of semiconductor die 125 (with the semiconductor die 125 depicted as optically transparent to show the die attach material 130) onto the die pad 105 where the die attach material 130 can be seen to have flown along the slits 311. Following wirebonding to add bond wires shown in FIG. 1 as 132, the electronic assembly shown in FIG. 1A is formed. An encapsulation step generally follows wirebonding, followed by singulation.

Disclosed substrates can also be used for a variety of electronic assemblies. One example is for flip chip mounted semiconductor die.

Advantages of disclosed embodiments include the ability to use industry standard equipment. Moreover, there is no need for 100% coverage of the die attach material, thus saving die attach material. Other advantages include the ability to mount with larger die sizes without increasing die pad size, or the package footprint.

Disclosed embodiments can be integrated into a variety of assembly flows to form a variety of different IC devices and related products. Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

We claim:

1. A method of forming an electronic assembly, comprising:
dispensing a die attach material on a substrate into a recessed portion that includes an inner recessed portion of a die pad of said substrate that includes an outer raised flat portion, but not on said outer raised flat portion, and
attaching a semiconductor die directly on said outer raised flat portion and affixing said semiconductor die with said die attach material in said interior recessed portion but not on said outer raised flat portion, wherein a gap exists under said semiconductor die along at least a portion of a boundary between an outer edge of said die attach material on said inner recessed portion and an inside edge of said outer raised flat portion.

2. The method of claim 1, wherein said substrate comprises a metal or metal alloy and is part of a lead frame that includes a plurality of lead fingers that are outside at least one side of said die pad, and wherein bond pads on said semiconductor die are connected to said plurality of lead fingers.

3. The method of claim 1, wherein said substrate comprises a dielectric substrate having a top substrate surface and a metal or metal alloy layer on said top substrate surface including a plurality substrate bond pads that are positioned outside at least one side of said die pad,
further comprising a solder resist layer comprising a solder resist material on said metal layer, wherein said solder resist layer inside said die pad provides said outer raised flat portion, defines said inner recessed portion, and exposes said plurality bond pads, wherein said semiconductor die has its bottomside affixed to said die pad by said die attach material.

4. The method of claim 1, wherein said inner recessed portion is exclusive of said solder resist material.

5. The method of claim 3, wherein said recessed portion further comprises at least one slit that is exclusive of said solder resist, and wherein said slit is connected to said inner recessed portion, and said die attach material is also within said slit after said attaching.

6. The method of claim 5, wherein said at least one slit comprises a plurality of said slits.

* * * * *